United States Patent [19]
Ohtani et al.

[11] Patent Number: 6,151,744
[45] Date of Patent: Nov. 28, 2000

[54] METHOD OF AND APPARATUS FOR CLEANING SUBSTRATE

[75] Inventors: Masami Ohtani; Masahide Ikeda; Mitsuhiro Fujita; Joichi Nishimura, all of Kyoto, Japan

[73] Assignee: Dainippon Screen Mfg. Co., Ltd., Japan

[21] Appl. No.: 08/839,470

[22] Filed: Apr. 14, 1997

[30]  Foreign Application Priority Data

Apr. 15, 1996  [JP]  Japan ...................................... 8-092608
Aug. 22, 1996  [JP]  Japan ...................................... 8-221260

[51] Int. Cl.[7] .................................................. A46B 13/02
[52] U.S. Cl. ................................. 15/88.2; 15/21.1; 15/77
[58] Field of Search .............................. 15/21.1, 77, 88.2, 15/88.3, 88.4, 102

[56]  References Cited

U.S. PATENT DOCUMENTS

| | | | |
|---|---|---|---|
| 5,351,360 | 10/1994 | Suzuki | 15/102 |
| 5,421,056 | 6/1995 | Tateyama | 15/21.1 |
| 5,485,644 | 1/1996 | Shinbara | 15/21.1 |
| 5,518,542 | 5/1996 | Matsukawa | 15/88.2 |
| 5,636,401 | 6/1997 | Yonemizu | 15/21.1 |
| 5,651,160 | 7/1997 | Yonemizu | 15/88.2 |

FOREIGN PATENT DOCUMENTS 695382  11/1994  Japan .

*Primary Examiner*—Randall E. Chin
*Attorney, Agent, or Firm*—Ostrolenk, Faber, Gerb & Soffen, LLP

[57]  ABSTRACT

A method of and apparatus for cleaning a substrate which require shorter processing time with high processing efficiency are disclosed. A cleaning brush pivots about a pivot axis between two positions. An ultrasonic cleaning nozzle pivots about a pivot axis between two positions. To perform a cleaning process, the cleaning brush and the ultrasonic cleaning nozzle are driven in accordance with a processing pattern previously produced by an operator. The processing pattern is produced so that the movement of the cleaning brush between two positions and the movement of the ultrasonic cleaning nozzle between two positions are not caused simultaneously. Any processing pattern desired by the operator may be produced if this requirement is satisfied. Execution of the cleaning process in accordance with the processing pattern allows cleaning of a substrate using the cleaning brush and the ultrasonic cleaning nozzle at the same time.

4 Claims, 14 Drawing Sheets

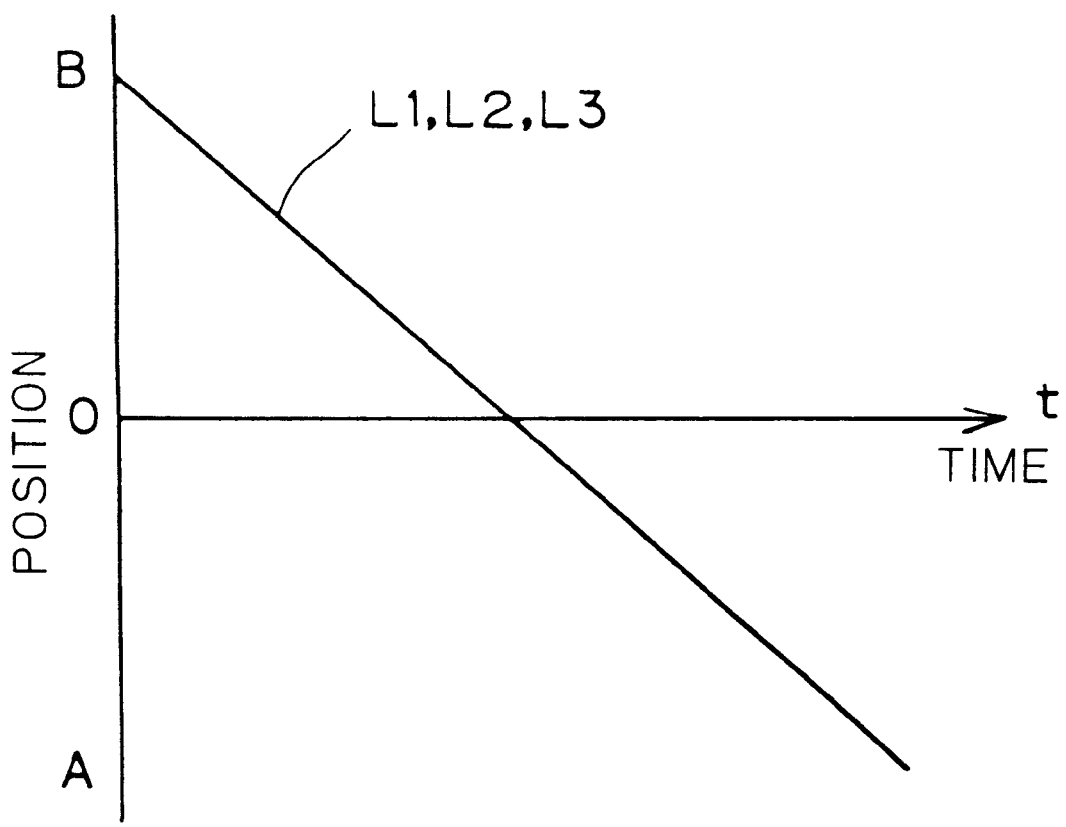
F I G . 12

METHOD OF AND APPARATUS FOR CLEANING SUBSTRATE

BACKGROUND OF THE INVENTION

1. Field of the Invention

The present invention relates to a method of and apparatus for cleaning a sheet-like substrate (referred to hereinafter as a "substrate") such as a semiconductor substrate or a glass substrate for liquid crystal display while rotating the substrate.

2. Description of the Background Art

In general, the substrate is sequentially subjected to various processes such as resist coating, exposure, and development for desired substrate processing. Since contamination by particles and the like deposited on the substrate during the above described processes results in significantly deteriorated characteristics of the processed substrate, the substrate cleaning apparatus cleans the substrate using various cleaning means such as a cleaning brush, an ultrasonic cleaning nozzle, a high-pressure cleaning nozzle or a cleaning chemical dispensing nozzle.

Each of the various cleaning means is provided on the forward end of an arm having a pivot axis outside a rotary table for placing and rotating the substrate thereon. By the pivotal movement of the arm, the cleaning means are retracted externally to of the rotary table so as not to interfere with loading or unloading the substrate before and after the cleaning process, and are positioned over a surface of the substrate during the cleaning process.

The cleaning brush, during the cleaning process, is positioned in contact with or in slightly spaced relation with the substrate, and is driven from the center of rotation of the substrate toward the periphery thereof to sweep away the particles on the substrate surface.

The ultrasonic cleaning nozzle, and high-pressure cleaning nozzle during the cleaning process, are driven so that a cleaning fluid delivered therefrom reaches locations on the substrate surface in a reciprocal manner between the center of rotation of the substrate and the periphery thereof, and function to peel off the particles deposited on the substrate. The peeled particles are removed by centrifugal force caused by the rotation of the substrate.

To clean the substrate more positively, there has been used a substrate cleaning apparatus comprising the plurality of above described cleaning means. Such a substrate cleaning apparatus is designed such that the plurality of cleaning means sequentially move toward positions over the substrate to clean the substrate.

However, the substrate cleaning apparatus wherein one of the cleaning means performs the cleaning process while the other cleaning means are retracted externally to of the rotary table in a repeated manner requires prolonged cleaning time, resulting in low processing efficiency.

SUMMARY OF THE INVENTION

The present invention is directed to an apparatus for cleaning a surface of a substrate while rotating the substrate.

According to the present invention, the apparatus comprises: a) a plurality of cleaning elements operable to scan the surface for cleaning the surface along respective predetermined paths each including a center of the surface; b) a plurality of driving elements for driving the plurality of cleaning elements, respectively; and c) a controller for controlling the plurality of driving elements such that a cleaning process of the surface includes a simultaneous cleaning operation of the plurality of the cleaning elements on the surface.

The plurality of cleaning elements may simultaneously clean the substrate. This requires shorter cleaning time than the sequential use of the plurality of cleaning elements one by one to clean the substrate, thereby enhancing processing efficiency.

In one aspect of the present invention, the apparatus further comprises: d) inputting elements for inputting at least one driving pattern for the plurality of cleaning elements; and e) a memory for storing the at least one driving pattern; wherein the controller elements controls the plurality of driving elements in accordance with the at least one driving pattern.

The present invention is also directed to a method of cleaning a surface of a substrate while rotating the substrate.

It is therefore an object of the present invention to provide a method of and apparatus for cleaning a substrate which require a shorter time to perform a series of processes and which achieve higher processing efficiency.

These and other objects, features, aspects and advantages of the present invention will become more apparent from the following detailed description of the present invention when taken in conjunction with the accompanying drawings.

BRIEF DESCRIPTION OF THE DRAWINGS

FIG. 12 illustrates a processing pattern applied to the rotary substrate cleaning apparatus of FIG. 11;

DESCRIPTION OF THE PREFERRED EMBODIMENTS

One preferred embodiment according to the present invention will now be described in detail with reference to the drawings.

Figure 1:
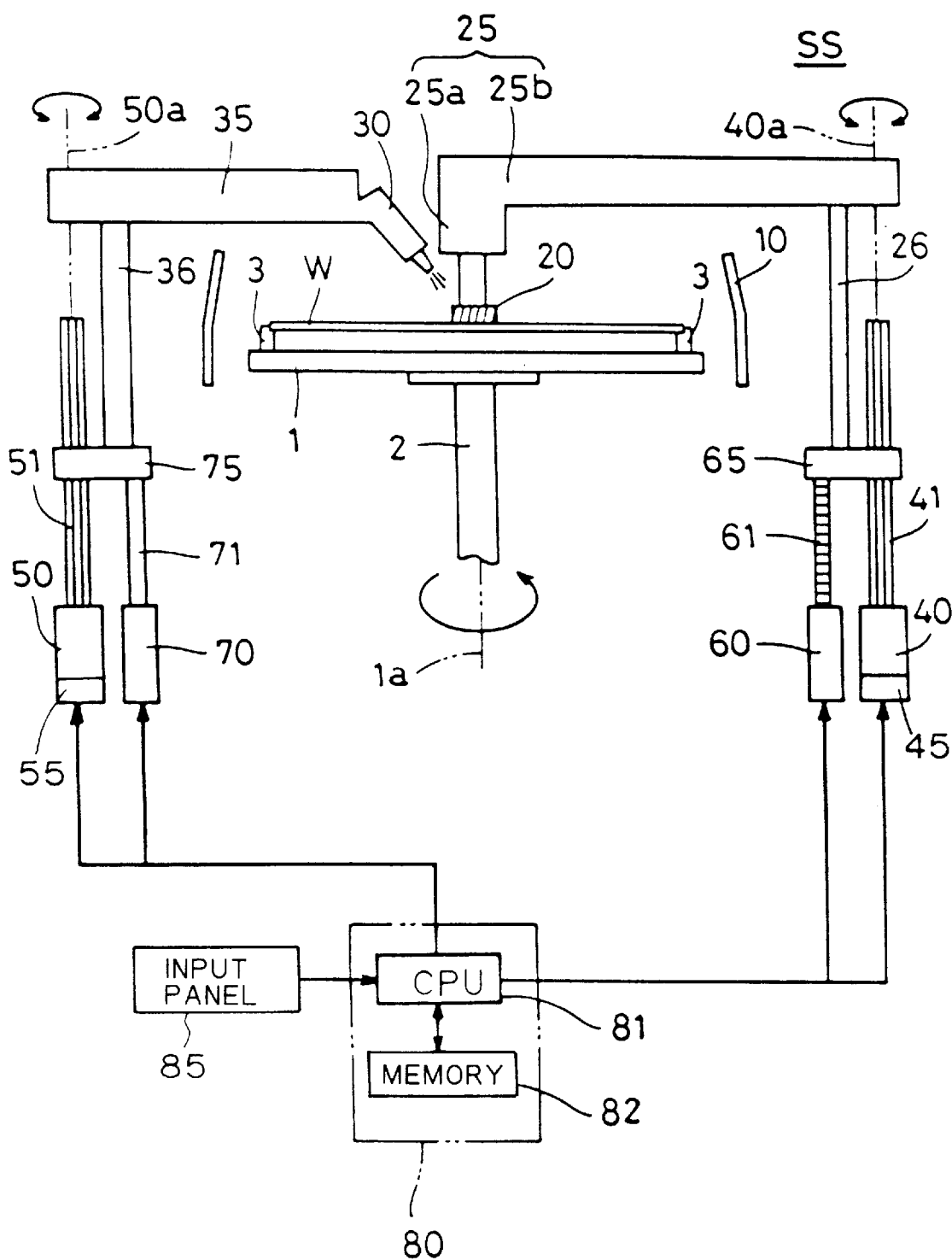
FIG. 1 schematically illustrates a rotary substrate cleaning apparatus (spin scrubber) according to one preferred embodiment of the present invention.

FIG. 1 schematically illustrates a rotary substrate cleaning apparatus (spin scrubber) SS according to one preferred embodiment of the present invention. In the rotary substrate cleaning apparatus SS, a substrate supporting member 3 provided on an upper surface of a rotary table 1 supports a substrate W. The rotary table 1 is coupled to a motor not shown by a motor shaft 2, and is driven for rotation about a rotational axis 1a. As the rotary table 1 is driven for rotation, the substrate W is also rotated about the rotational axis 1a.

A cleaning brush 20 is in contact with or in closely spaced relation to the rotating substrate W to clean the substrate W. The cleaning brush 20 is mounted on a suspended portion 25a of a brush arm 25 which in turn is permitted to pivot and vertically move by a pulse motor 40 and a pulse motor 60. Specifically, a support block 65 is fitted by splined engagement over a motor shaft 41 of the pulse motor 40, and is in threaded engagement with a ball screw 61 of the pulse motor 60. The ball screw 61 and the support block 65 are coupled to each other so that the support block 65 is pivoted about a pivot axis 40a by the pulse motor 40. A vertically extending support rod 26 is mounted on an upper surface of the support block 65, and a horizontal portion 25b of the brush arm 25 is fixedly coupled to the top end of the support rod 26. Thus, the pulse motor 60 and the pulse motor 40 may vertically move and pivot the support block 65, accordingly vertically moving the brush arm 25 and pivoting the brush arm 25 about the pivot axis 40a.

During the cleaning process, a cleaning fluid is delivered from an ultrasonic cleaning nozzle 30 in addition to the cleaning by the cleaning brush 20. The ultrasonic cleaning nozzle 30 is a nozzle including an ultrasonic oscillator for exposing the cleaning fluid to an ultrasonic wave to enhance the cleaning capability. The ultrasonic cleaning nozzle 30 is mounted on the forward end of a nozzle arm 35 which in turn is permitted to vertically move and pivot by an air cylinder 70 and a pulse motor 50. A support block 75 on which a vertically extending support rod 36 fixedly coupled to the nozzle arm 35 is mounted is fitted by splined engagement over a motor shaft 51 of the pulse motor 50 and is coupled to a piston 71 of the air cylinder 70. The piston 71 and the support block 75 are coupled to each other so that the support block 75 may pivot about a pivot axis 50a. Thus, the nozzle arm 35 is vertically moved by the air cylinder 70 and is pivoted about the pivot axis 50a by the pulse motor 50. The nozzle arm 35 uses the air cylinder 70 but the brush arm 25 uses the pulse motor 60 for vertical movement thereof. Thus, the brush arm 25 is faster in moving speed and response than the nozzle arm 35 for ease of time management for processing including vertical movement. The element for vertically moving the support block 75 is not limited to the air cylinder but may be an electromagnetic actuator or the like.

Figure 2:
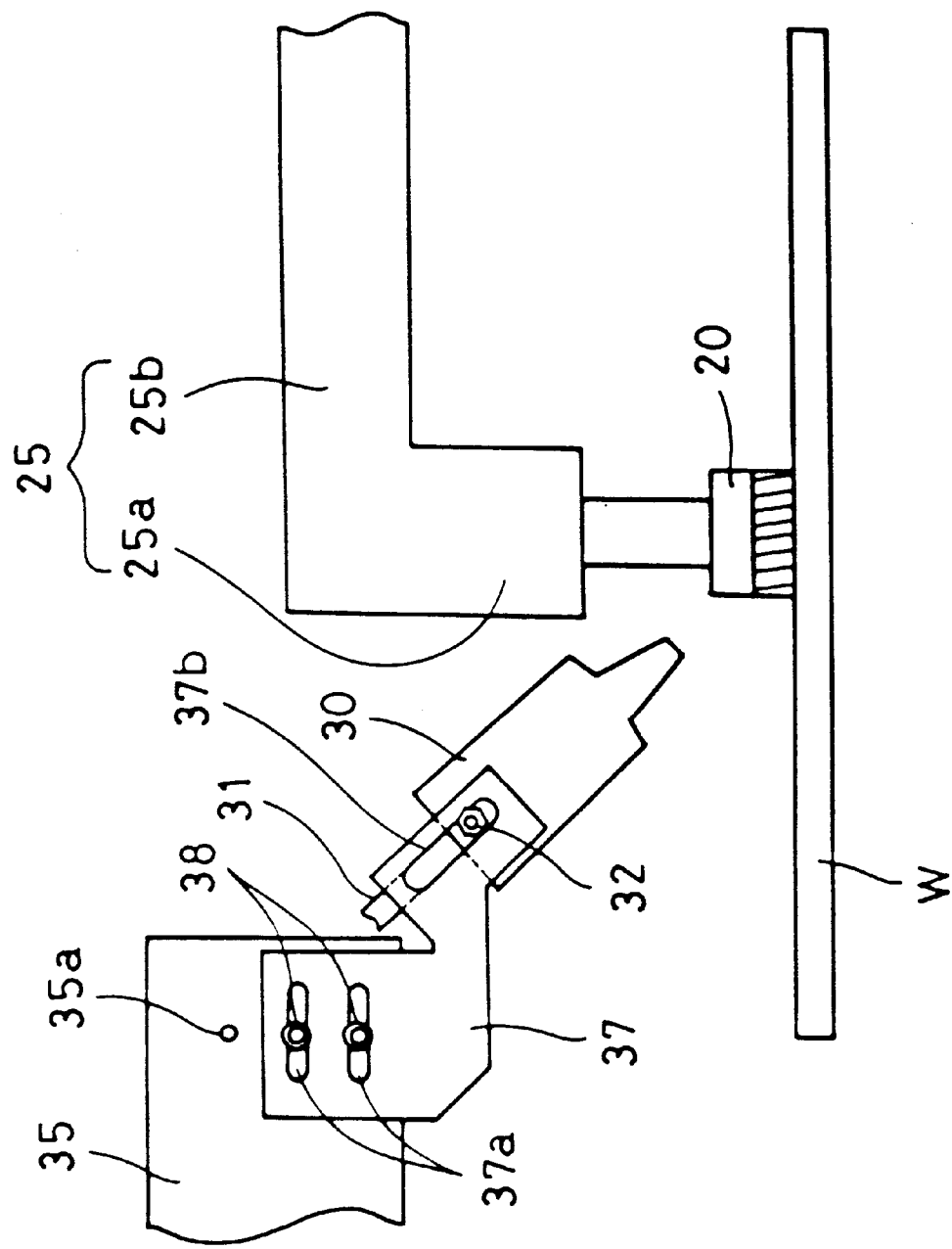
FIG. 2 illustrates an ultrasonic cleaning nozzle of the rotary substrate cleaning apparatus of FIG. 1 which is held.

The ultrasonic cleaning nozzle 30 is mounted on the nozzle arm 35 so that the direction of the delivery of the cleaning fluid is at a predetermined angle with respect to the substrate W. FIG. 2 illustrates the ultrasonic cleaning nozzle 30 in more detail. The nozzle arm 35 has a forward end portion formed with three vertically arranged screw holes 35a. Two of the screw holes 35a are used to hold a nozzle holding member 37. Specifically, the nozzle holding member 37 has two elongated holes 37a. In the structure of FIG. 2, two screws 38 inserted through the elongated holes 37a threadedly engage the lower two of the three screw holes 35a to hold the nozzle holding member 37.

The nozzle holding member 37 has an elongated hole 37b, and the ultrasonic cleaning nozzle 30 is fastened to the nozzle holding member 37 by a nut 32 at a desired position of the elongated hole 37b. The ultrasonic cleaning nozzle 30 is then held in such a position that the direction of the delivery of the cleaning fluid is at the predetermined angle with respect to a major surface of the substrate W. The above described construction allows the ultrasonic cleaning nozzle 30 to be held inclined and at adjustable position and angle. Therefore, the ultrasonic cleaning nozzle 30 and the cleaning brush 20 do not interfere with each other if they are positioned adjacent the center of rotation of the substrate W.

The ultrasonic cleaning nozzle 30 is coupled to a cable 31 for feeding the cleaning fluid. The cleaning fluid fed from the cable 31 is exposed to the ultrasonic wave in the ultrasonic cleaning nozzle 30 and is then delivered from the ultrasonic cleaning nozzle 30. The delivered cleaning fluid reaches the upper surface of the substrate W adjacent a position at which the cleaning brush 20 contacts the substrate W.

Returning to FIG. 1, a cup 10 for collecting the cleaning fluid scattered from the substrate W and the rotary table 1 during the rotation is provided around the rotary table 1.

The pulse motor 40 for driving the brush arm 25 and the pulse motor 50 for driving the nozzle arm 35 include an encoder 45 and an encoder 55, respectively. The encoders 45 and 55 detect the rotation of the pulse motors 40 and 50 to detect the position, direction and speed of pivotal movement of the brush arm 25 and nozzle arm 35, respectively. The encoders 45 and 55 are electrically connected to a control portion 80 to transmit detected signals to the control portion 80.

The control portion 80 comprises a CPU 81 and a memory 82, and is connected to an input panel 85 provided on the rotary substrate cleaning apparatus SS. The CPU 81 verifies the signals transmitted from the encoders 45 and 55 in accordance with a processing pattern (driving pattern) entered from the input panel 85 to apply commands to the pulse motors 40 and 50. The pulse motor 60 and the air cylinder 70 are also electrically connected to the CPU 81, and operate in response to commands from the CPU 81.

A cleaning procedure using the rotary substrate cleaning apparatus SS will be described below. For the cleaning process, an operator initially sets and enters a desired processing pattern, and then the cleaning brush 20 and the ultrasonic cleaning nozzle 30 clean the substrate W in accordance with the processing pattern.

Figure 3:
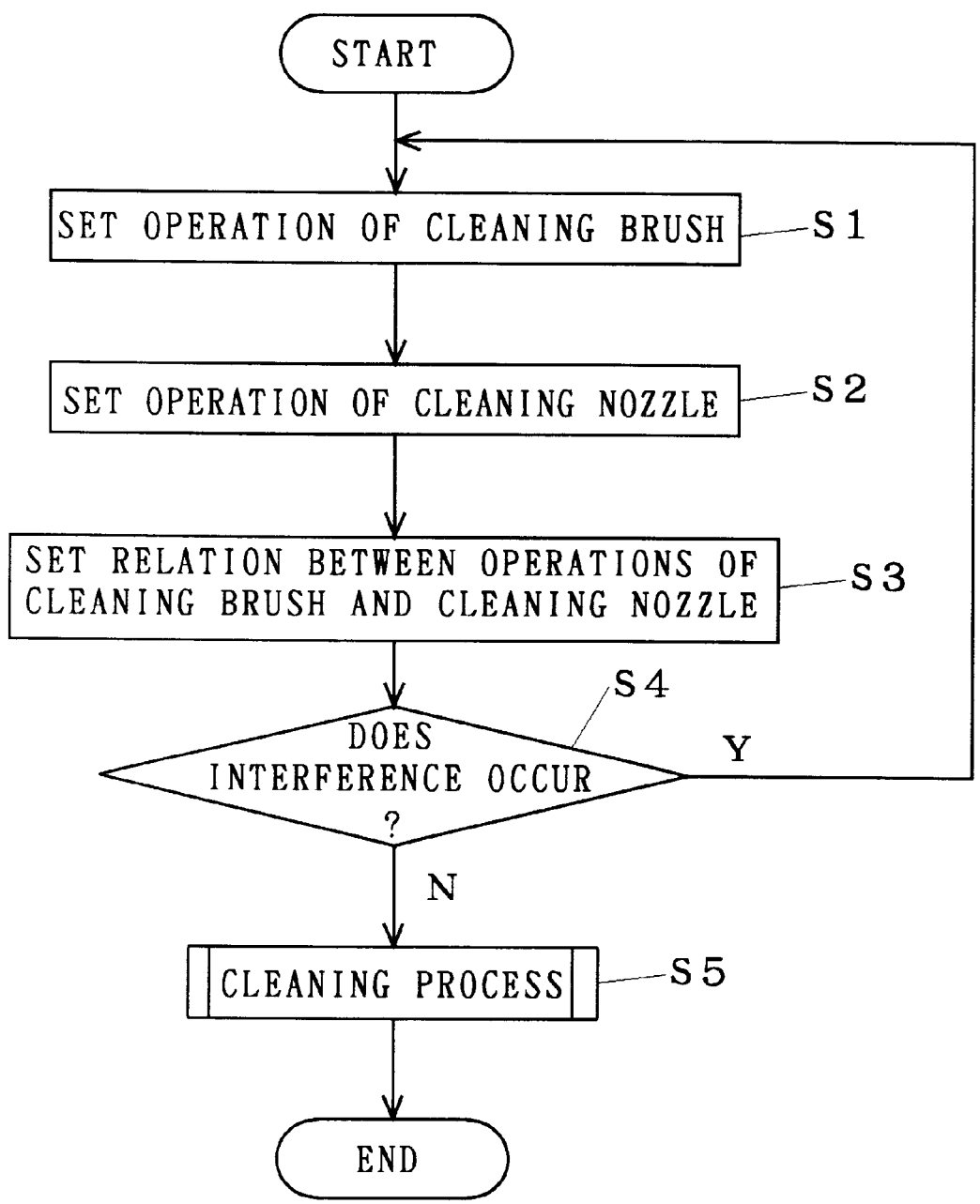
FIG. 3 is a flow chart showing a cleaning procedure using the rotary substrate cleaning apparatus of FIG. 1.

FIG. 3 is a flow chart showing the cleaning procedure using the rotary substrate cleaning apparatus SS. First, the operator sets the operation of the cleaning brush 20 process step S1). The operation setting is carried out by entering the processing start time of the cleaning brush 20, the length of processing time, and the pivot speed of the brush arm 25 from the input panel 85.

Then, the operation of the ultrasonic cleaning nozzle 30 is set (process step S2). The operation setting is carried out by the operator entering the processing start time, the length of processing time, and the pivot speed of the nozzle arm 35 from the input panel 85, in similar manner to that of the cleaning brush 20. It should be noted that the operations of the cleaning brush 20 and ultrasonic cleaning nozzle 30 may be set in reverse order.

The flow continues into the process step S3 wherein the relation between the operations of the cleaning brush 20 and ultrasonic cleaning nozzle 30 is set (process step S3). In the process step S3, the operator selects whether the cleaning brush 20 and the ultrasonic cleaning nozzle 30 are driven simultaneously or alternately to clean the substrate W.

A sequence of above described settings produce the processing pattern of the cleaning brush 20 and the ultrasonic cleaning nozzle 30. The produced processing pattern is stored in the memory 82. The sequence of settings may be repeated to simultaneously produce a plurality of processing patterns.

Next, the CPU 81 judges whether or not the cleaning brush 20 and the ultrasonic cleaning nozzle 30 interfere with each other when the cleaning process is performed in accordance with the processing pattern produced by the operator (process step S4). The interference between the cleaning brush 20 and the ultrasonic cleaning nozzle 30 is discussed hereinafter.

Figure 5:
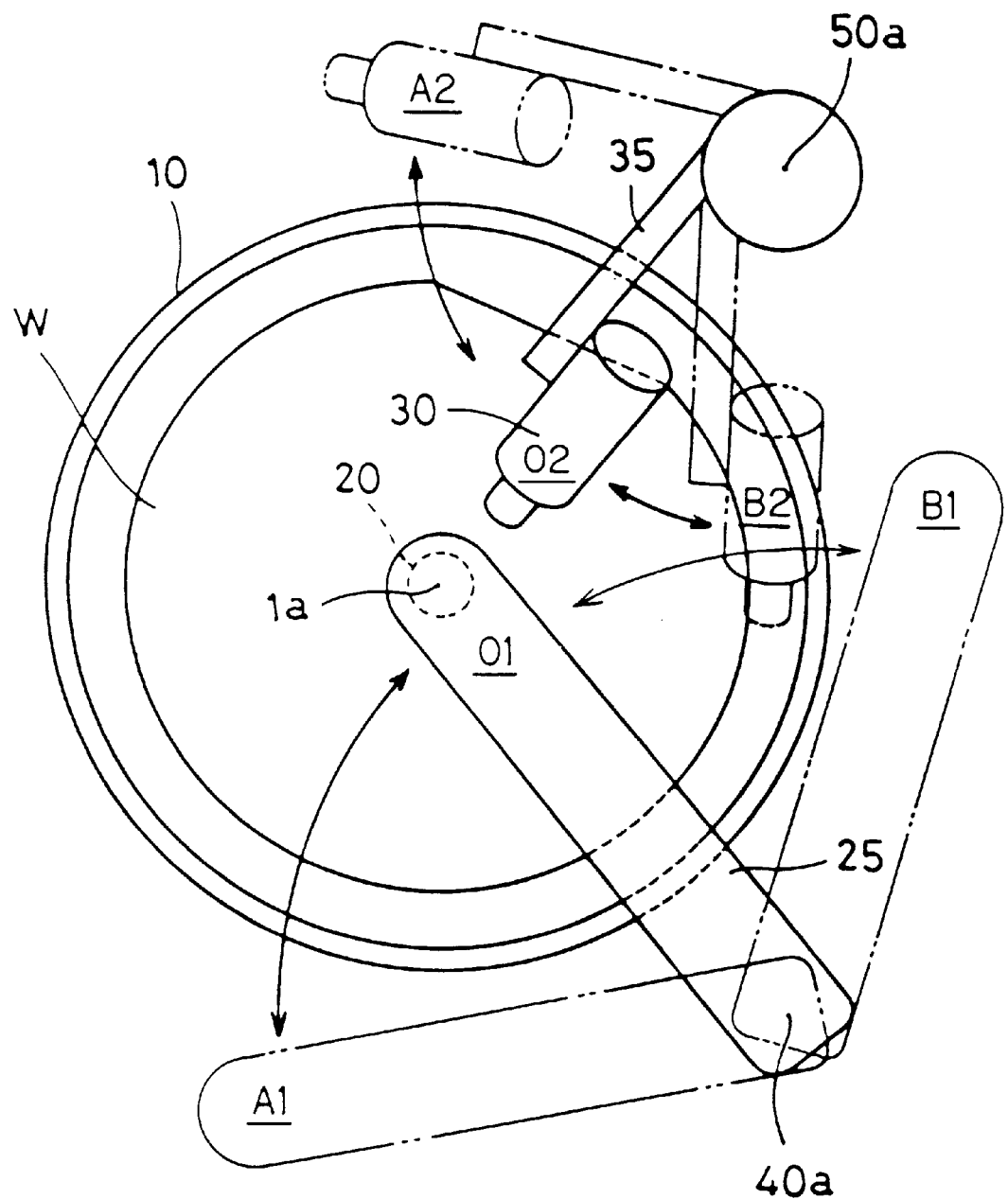
FIG. 5 is a plan view showing an arrangement of a cleaning brush and the ultrasonic cleaning nozzle.

FIG. 5 is a plan view illustrating an arrangement of the cleaning brush 20 and the ultrasonic cleaning nozzle 30. In the arrangement of FIG. 5, there is a possibility that the cleaning brush 20 and the ultrasonic cleaning nozzle 30 interfere with each other when the cleaning brush 20 moves between a position O1 and a position B1 and the ultrasonic cleaning nozzle 30 moves between a position O2 and a position B2.

Figure 6:
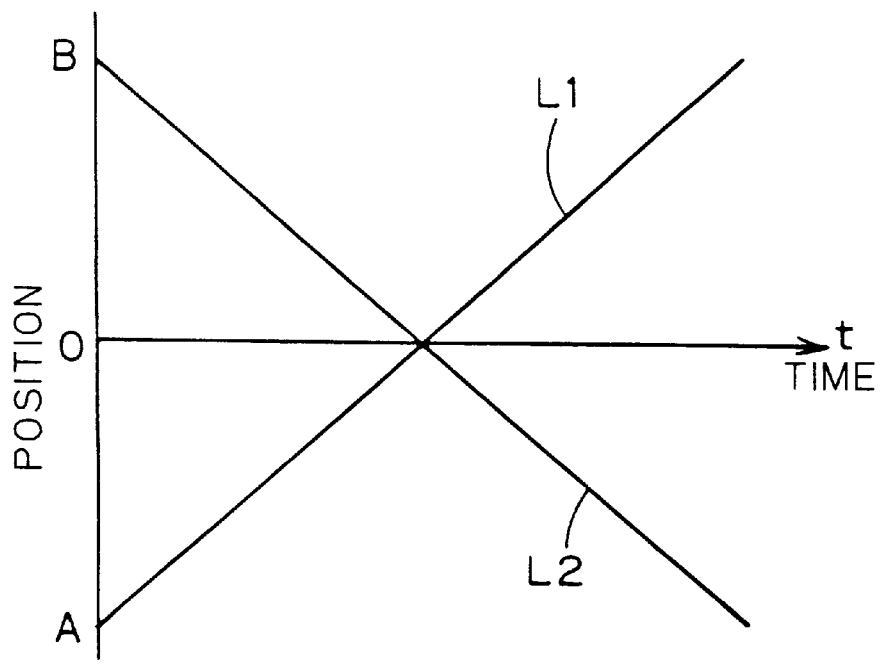
FIG. 6 illustrates a processing pattern according to the invention entered by an operator.

FIG. 6 illustrates a processing pattern entered by the operator. The vertical axis of FIG. 6 is the pivot position of the cleaning brush 20 and the ultrasonic cleaning nozzle 30, and the horizontal axis thereof is the processing time. The line L1 of FIG. 6 represents an operation pattern of the cleaning brush 20, and the line L2 represents an operation pattern of the ultrasonic cleaning nozzle 30. The position A1 of the cleaning brush 20 and the position A2 of the ultrasonic cleaning nozzle 30 illustrated in FIG. 5 correspond to the position A of FIG. 6. Likewise, the position O1 of the cleaning brush 20 and the position O2 of the ultrasonic cleaning nozzle 30 correspond to the position O position adjacent the center of rotation of the substrate W) of FIG. 6, and the position B1 of the cleaning brush 20 and the position B2 of the ultrasonic cleaning nozzle 30 correspond to the position B of FIG. 6. In this processing pattern, the cleaning brush 20 pivots at a constant speed from the position A1 through the position O1 to the position B1, and the ultrasonic cleaning nozzle 30 pivots at a constant speed from the position B2 through the position O2 to the position A2.

Referring to FIG. 6, when both of the lines L1 and L2 are above the horizontal axis (time axis) at the same time, the cleaning brush 20 is located between the positions O1 and B1 and the ultrasonic cleaning nozzle 30 is located between the positions O2 and B2, creating the possibility that the cleaning brush 20 and the ultrasonic cleaning nozzle 30 interfere with each other as described above. In such a case, the CPU 81 judges that the cleaning brush 20 and the ultrasonic cleaning nozzle 30 interfere with each other, and the flow returns to the process step S1 for reentry of the processing pattern. The CPU 81 judges that the interference occurs when both of the lines L1 and L2 of FIG. 6 are above the horizontal axis (time axis) at the same time for purposes of convenience. However, the position at which the interference occurs changes, for example, by adjusting the position and angle at which the ultrasonic cleaning nozzle 30 is mounted on the nozzle arm 35. The operator may instruct the CPU 81 about the position at which the interference occurs as required.

In the processing pattern shown in FIG. 6, both of the lines L1 and L2 are not above the horizontal axis at the same time. The CPU 81 then judges that no interference occurs, and the flow proceeds to the process step S5 for execution of the cleaning process.

Figure 4:
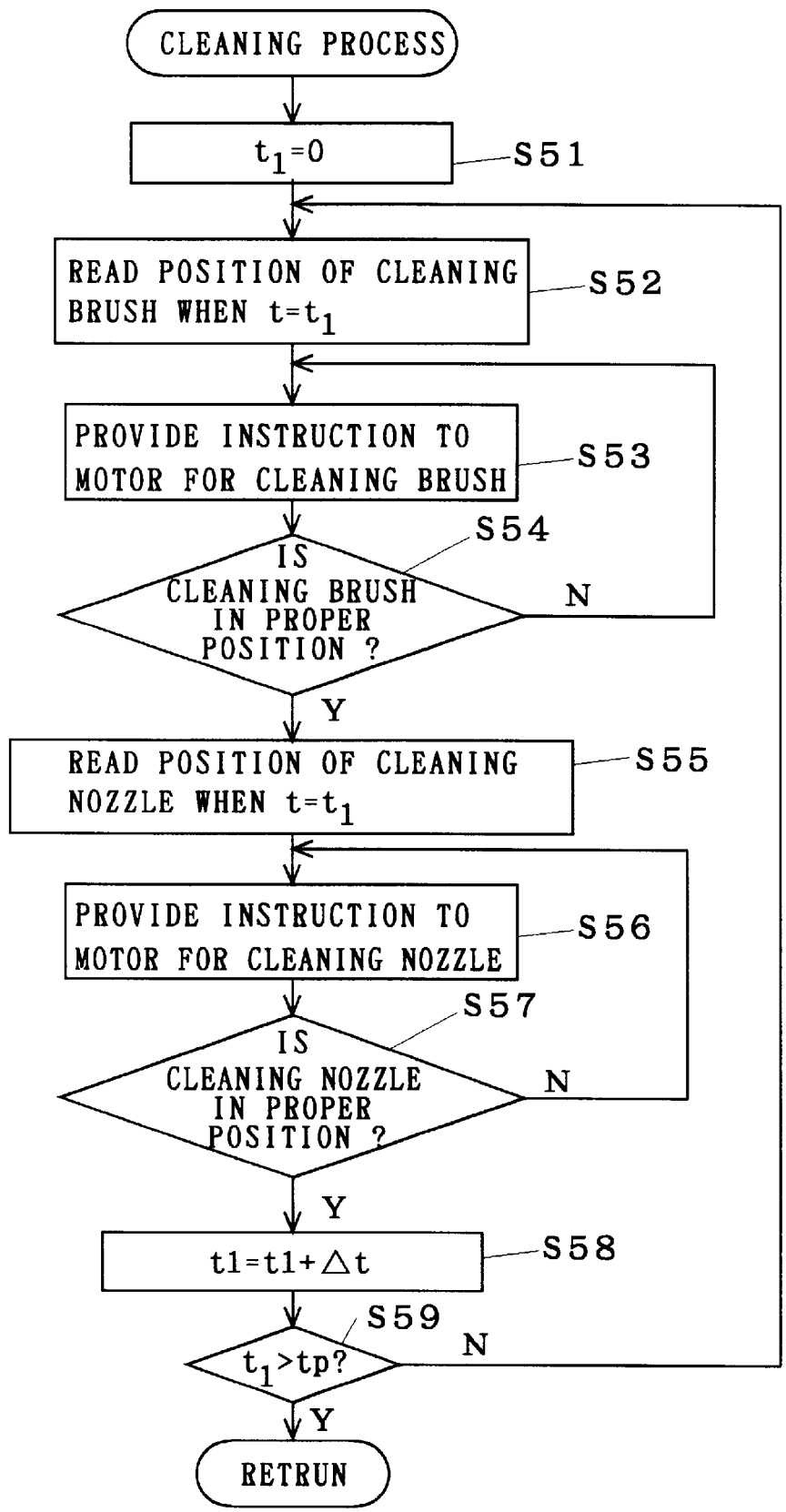
FIG. 4 is a flow chart showing a procedure of for a cleaning process according to one aspect of the invention.

FIG. 4 is a flow chart illustrating the procedure of the cleaning process. First, the CPU 81 sets a variable $t_1$ to "0" (process step S51). The CPU 81 then reads the position of the cleaning brush 20 when time t equals the variable $t_1$ from the processing pattern stored in the memory 82 (process step S52). The CPU 81 provides an instruction to the pulse motor 40 so that the cleaning brush 20 moves to the read position (process step S53). The pulse motor 40 drives the cleaning brush 20, and the encoder 45 detects the rotation of the pulse motor 40 to detect the position of the cleaning brush 20. The signal detected by the encoder 45 is transmitted to the CPU 81 which in turn judges whether or not the cleaning brush 20 has reached the read position (process step S54). If the cleaning brush 20 has not reached the read position, the flow returns to the process step S53, and the CPU 81 provides the instruction to the pulse motor 40 again.

If the cleaning brush 20 has reached the read position, the flow proceeds to the process step S55 wherein the position of the ultrasonic cleaning nozzle 30 when time t equals the variable $t_1$ is read from the processing pattern. The CPU 81 then provides an instruction to the pulse motor 50 in the above described manner so that the ultrasonic cleaning nozzle 30 moves to the read position (process step S56). The pulse motor 50 drives the ultrasonic cleaning nozzle 30, and the encoder 55 detects the rotation of the pulse motor 50 to detect the position of the ultrasonic cleaning nozzle 30. The signal detected by the encoder 55 is transmitted to the CPU 81 which in turn judges whether or not the ultrasonic cleaning nozzle 30 has reached the read position (process step S57). If the ultrasonic cleaning nozzle 30 has not reached the read position, the flow returns to the process step S56, and the CPU 81 provides the instruction to the pulse motor 50 again.

If the ultrasonic cleaning nozzle 30 has reached the read position, the flow proceeds to the process step S58 wherein a predetermined time $\Delta t$ is added to the variable $t_1$. The predetermined time $\Delta t$ is the time corresponding to the operation cycle of the CPU 81. Then, the flow proceeds to the process step S59 wherein the CPU 81 judges whether or not the variable ti is greater than a preset processing end time $t_p$. The flow returns to the process step S52 if the variable $t_1$ is not greater than the processing end time $t_p$, and the cleaning process is terminated if the variable $t_1$ is greater than the processing end time $t_p$. Thus, the above described processing sequence is repeated until the variable $t_1$ exceeds the processing end time $t_p$.

The execution of the processing pattern shown in FIG. 6 in accordance with the above described procedure of the cleaning process causes the cleaning brush 20 to pivot from the position A1 (FIG. 5) toward the position O1 and causes the ultrasonic cleaning nozzle 30 to pivot from the position B2 toward the position O2. At the same time that the cleaning brush 20 reaches the position O1, the ultrasonic cleaning nozzle 30 reaches the position O2 Both of the cleaning means cooperate to clean the substrate W adjacent the center of rotation of the substrate W. Then, the cleaning brush 20 pivots from the position O1 toward the position B1, and the ultrasonic cleaning nozzle 30 pivots from the position O2 toward the position A2. After completion of a sequence of driving processes in accordance with the processing pattern shown in FIG. 6, the cleaning brush 20 and the ultrasonic cleaning nozzle 30 repeatedly reciprocate between the positions A1 and B1 and between the positions A2 and B2, respectively, in accordance with the pattern reverse to the above described processing pattern.

The above described processing allows the cleaning brush 20 and the ultrasonic cleaning nozzle 30 to operate simultaneously to perform the cleaning process without interference therebetween, reducing the cleaning time and enhancing processing efficiency. The simultaneous use of the cleaning brush 20 and the ultrasonic cleaning nozzle 30 for cleaning provides synergistic effects of cleaning to enhance cleaning effects throughout the substrate W while ensuring the cleaning adjacent the center of rotation of the substrate W. In particular, kinetic energy by rotation is difficult to act upon the portion adjacent the center of rotation of the substrate W, and it is accordingly difficult to remove contamination from that portion. However, the synergistic effect of cleaning using the cleaning brush 20 and the ultrasonic cleaning nozzle 30 simultaneously enhances the cleaning effects adjacent the center of rotation of the substrate W.

Figure 7:
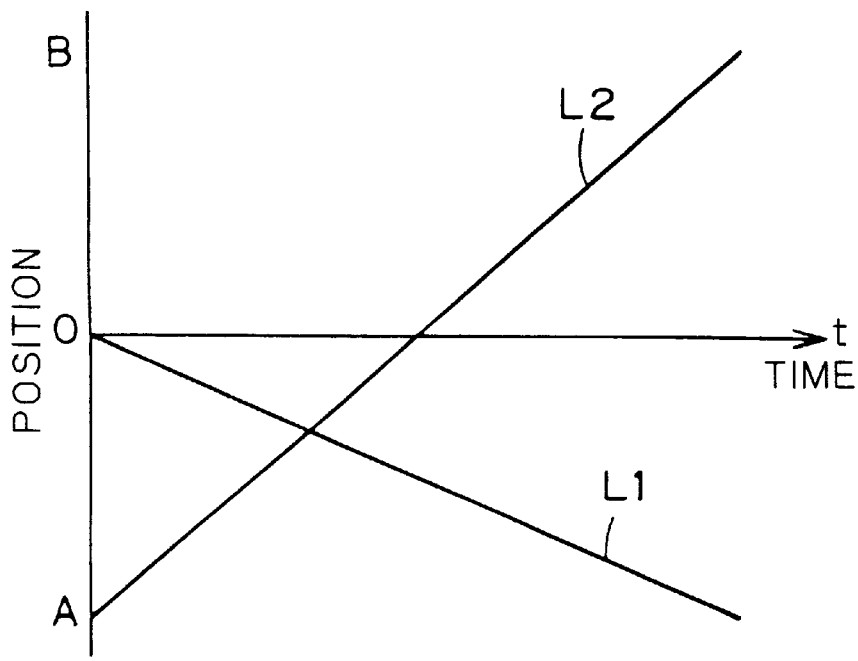
FIGS. 7 through 9 illustrate other processing patterns in accordance with the invention.
Figure 8:
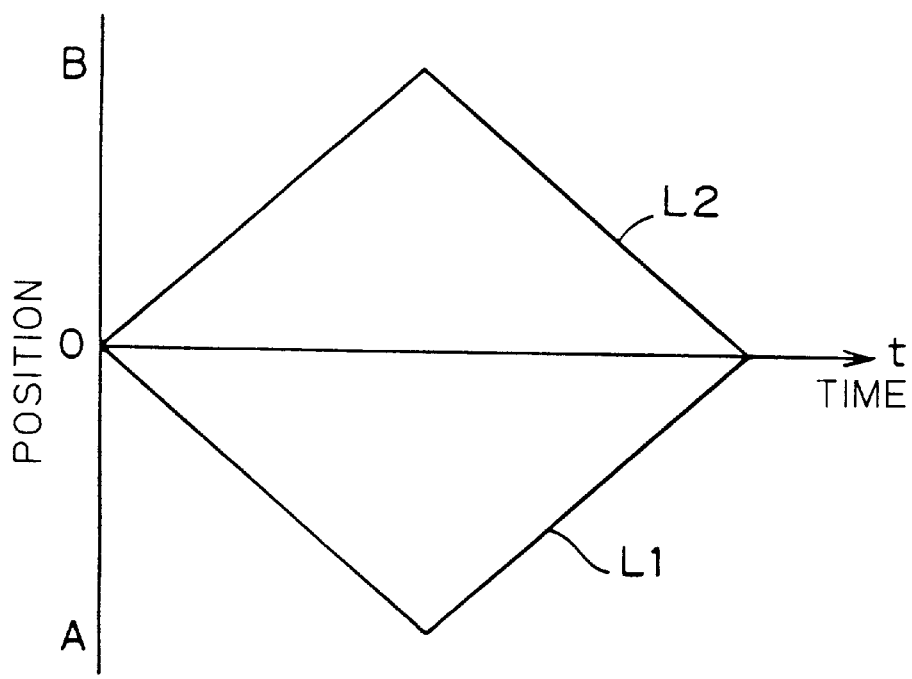
Figure 9:
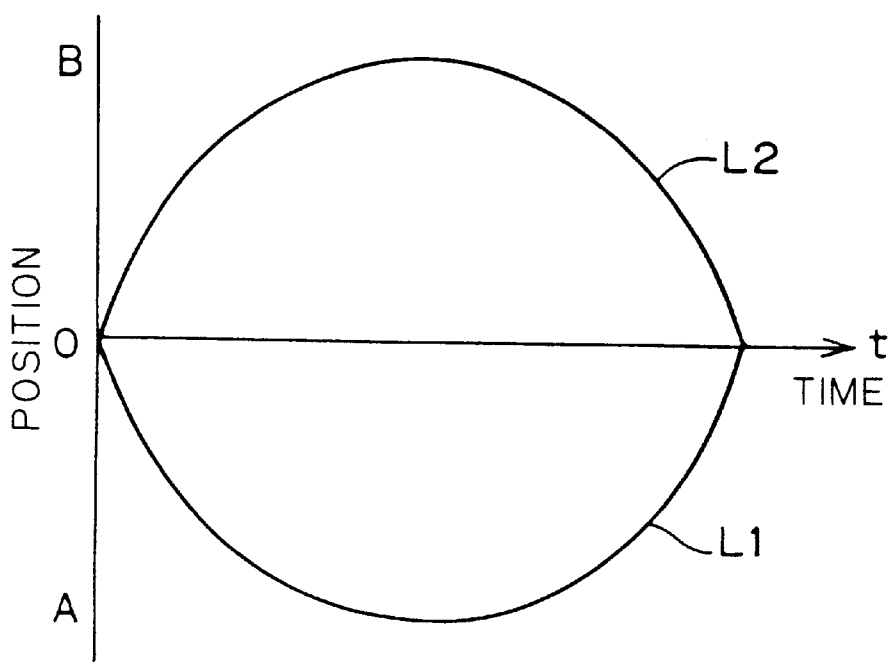

The processing pattern is not limited to that shown in FIG. 6 but may be any processing pattern which avoids the interference between the cleaning brush 20 and the ultrasonic cleaning nozzle 30. FIGS. 7 through 9 illustrate other processing patterns.

In the processing pattern shown in FIG. 7, the cleaning brush 20 pivots from the position O1 toward the position A1 while the ultrasonic cleaning nozzle 30 pivots from the position A2 toward the position B2. Such a processing pattern also permits the cleaning brush 20 and the ultrasonic cleaning nozzle 30 to operate simultaneously to perform the cleaning process without interference therebetween, reducing the cleaning time.

In the processing pattern shown in FIG. 8, the cleaning brush 20 reciprocates between the position O1 and the position A1 while the ultrasonic cleaning nozzle 30 reciprocates between the position O2 and the position B2. Such a processing pattern also permits the cleaning brush 20 and the ultrasonic cleaning nozzle 30 to operate simultaneously to perform the cleaning process without interference therebetween, reducing the cleaning time and enhancing the cleaning effects adjacent the center of rotation of the substrate W. In the reciprocal movement, the cleaning brush 20 is in contact with or in closely spaced relation to the surface of the substrate W to be cleaned while moving from the position O1 toward the position A1, that is, from adjacent the center of rotation of the substrate W toward the periphery thereof, but the cleaning brush 20 is spaced apart from the surface of the substrate W to be cleaned while moving from the position A1 toward the position O1, that is, from the periphery of the substrate W toward adjacent the center of rotation thereof.

In the processing pattern shown in FIG. 9, the cleaning brush 20 reciprocates between the position O1 and the position A1 while the ultrasonic cleaning nozzle 30 reciprocates between the position O2 and the position B2 as described above. The processing pattern shown in FIG. 9 differs from that shown in FIG. 8 in that the speed of the movement of the two cleaning elements varies as the cleaning elements travel. Specifically, the cleaning brush 20 and the ultrasonic cleaning nozzle 30 are driven at high speeds adjacent the positions O1 and O2 but are driven at low speeds adjacent the positions A1 and B2, respectively. The processing pattern shown in FIG. 9 also permits the cleaning brush 20 and the ultrasonic cleaning nozzle 30 to operate simultaneously to perform the cleaning process without interference therebetween, reducing the cleaning time.

As discussed above, any processing pattern may be produced so that the cleaning brush 20 and the ultrasonic cleaning nozzle 30 do not interfere with each other, and both of the cleaning elements perform the cleaning process in accordance with the processing pattern. This allows the operator to produce a desired processing pattern depending upon the types of films deposited on the surface of the substrate W to perform the cleaning process suitable for the film types.

Figure 10:
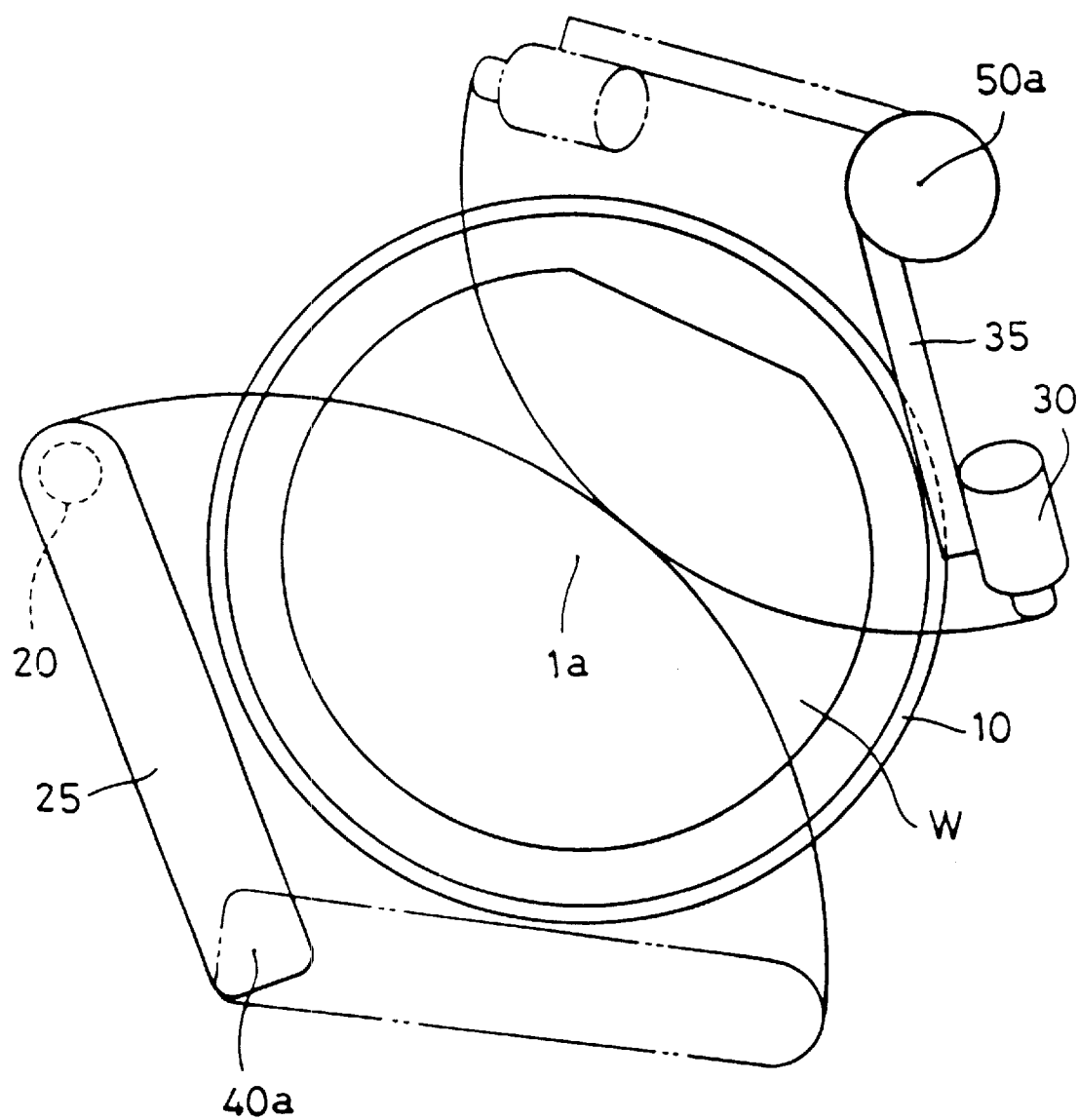
FIG. 10 is a plan view showing another arrangement of the cleaning brush and the ultrasonic cleaning nozzle.

The arrangement of the cleaning brush 20 and the ultrasonic cleaning nozzle 30 is not limited to that of FIG. 5. FIG. 10 is a plan view illustrating another arrangement of the cleaning brush 20 and the ultrasonic cleaning nozzle 30. The arrangement in a rotary substrate cleaning apparatus SS2 of FIG. 10 creates no possibility that the cleaning brush 20 and the ultrasonic cleaning nozzle 30 interfere with each other throughout their movable range, providing the setting of a more flexible processing pattern than the arrangement of FIG. 5. More specifically, there is a possibility that the cleaning brush 20 and the ultrasonic cleaning nozzle 30 interfere with each other when both of the lines L1 and L2 (FIG. 6) are above the horizontal axis of the processing pattern at the same time. On the other hand, there is no possibility of the interference in the arrangement of FIG. 10, providing free setting of the processing pattern.

Figure 11:
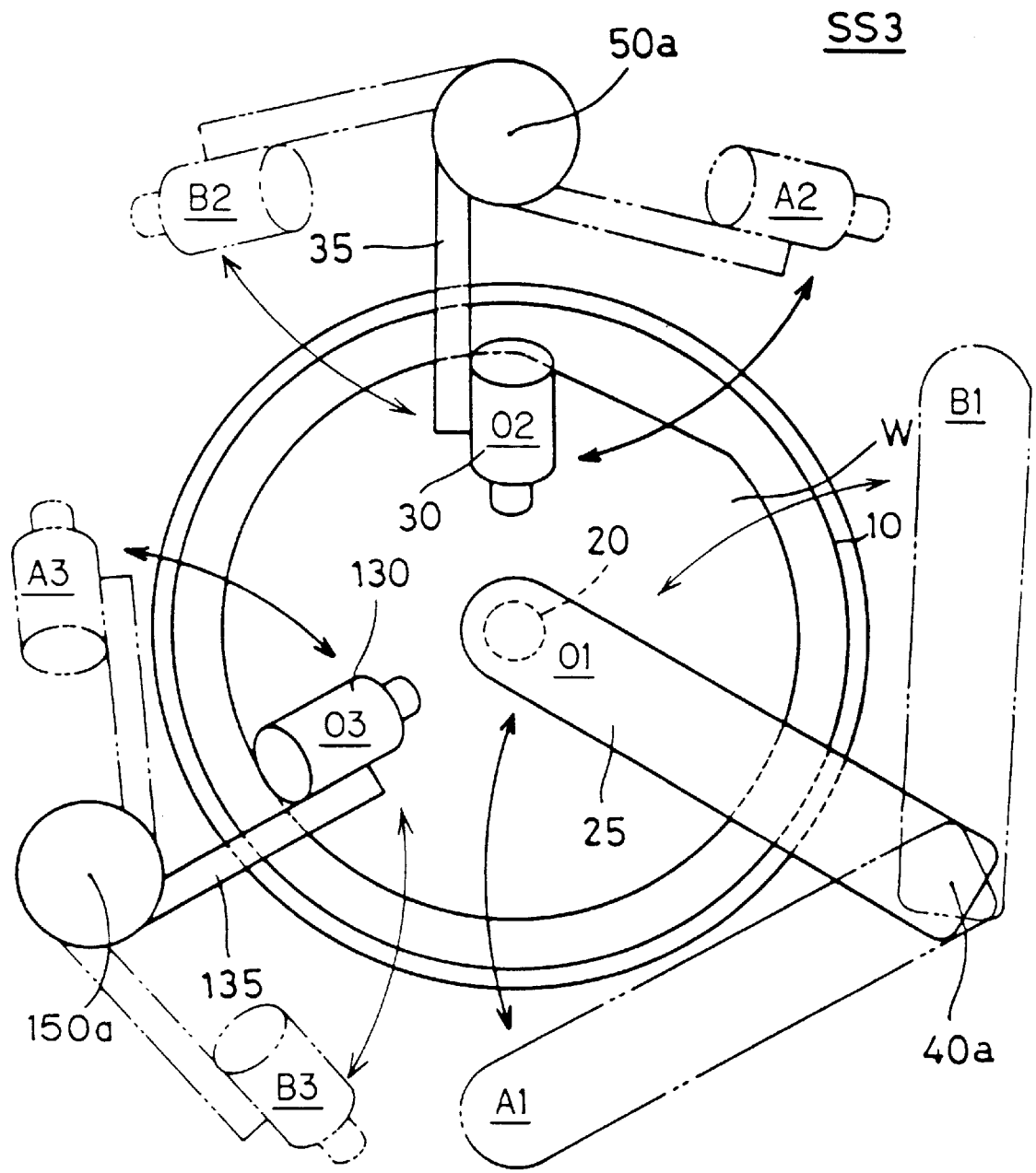
FIG. 11 is a plan view of a rotary substrate cleaning apparatus having three cleaning means.

The number of cleaning elements is not limited to two but may also be three or more. FIG. 11 is a plan view of a rotary substrate cleaning apparatus SS3 having three cleaning elements. The rotary substrate cleaning apparatus SS3 comprises a high-pressure cleaning nozzle 130 in addition to the cleaning brush 20 and the ultrasonic cleaning nozzle 30 of the rotary substrate cleaning apparatus SS. The high-pressure cleaning nozzle 130 is a nozzle for delivering high-pressure cleaning fluid to clean the substrate W.

The high-pressure cleaning nozzle 130 is mounted on the forward end of a nozzle arm 135 which in turn is permitted to vertically move and pivot about a pivot axis 150a by an air cylinder and a pulse motor (not shown), like the nozzle arm 35 to which the ultrasonic cleaning nozzle 30 is mounted. The air cylinder and pulse motor are controlled by the control portion 80 (See FIG. 1). The three cleaning elements do not interfere with each other when located adjacent the center of rotation of the substrate W at the same time since the ultrasonic cleaning nozzle 30 and the high-pressure cleaning nozzle 130 are inclined (See FIG. 2).

For the cleaning process using the rotary substrate cleaning apparatus SS3 like the rotary substrate cleaning apparatus SS, the operator initially produces a desired processing pattern. FIG. 12 illustrates a processing pattern applied to the rotary substrate cleaning apparatus SS3. In FIG. 12, the lines L1, L2 and L3 indicate the operation patterns of the cleaning brush 20, the ultrasonic cleaning nozzle 30, and the high-pressure cleaning nozzle 130, respectively. The position A1 of the cleaning brush 20, the position A2 of the ultrasonic cleaning nozzle 30, and the position A3 of the high-pressure cleaning nozzle 130 shown in FIG. 11 correspond to the position A of FIG. 12. Likewise, the position O1 of the cleaning brush 20, the position O2 of the ultrasonic cleaning nozzle 30, and the position O3 of the high-pressure cleaning nozzle 130 correspond to the position O of FIG. 12, and the position B1 of the cleaning brush 20, the position B2 of the ultrasonic cleaning nozzle 30, and the position B3 of the high-pressure cleaning nozzle 130 correspond to the position B of FIG. 12.

The processing pattern must be produced again if there is a possibility that the three cleaning elements interfere with each other in the processing pattern. The three cleaning elements of the rotary substrate cleaning apparatus SS3 might interfere with each other in the cases where the high-pressure nozzle 130 moves between the positions B3 and O3 while the cleaning brush 20 moves between the positions A1 an O1 and where the ultrasonic cleaning nozzle 30 moves between the positions A2 and O2 while the cleaning brush 20 moves between the positions O1 and B1.

The CPU 81 refers to the processing pattern of FIG. 12 to request the reproduction of the processing pattern if the plurality of cleaning elements are positioned to cause the interference at the same time.

The rotary substrate cleaning apparatus SS3 performs the cleaning process in accordance with the processing pattern of FIG. 12 in a manner similar to the rotary substrate cleaning apparatus SS. In accordance with the processing pattern of FIG. 12, the cleaning brush 20, the ultrasonic cleaning nozzle 30, and the high-pressure cleaning nozzle 130 pivot from the positions B1, B2, B3 toward the positions O1, O2, O3, respectively. The cleaning brush 20, the ultrasonic cleaning nozzle 30, and the high-pressure cleaning nozzle 130 reach the positions O1, O2, O3, respectively, at the same time. The three cleaning elements cooperate to clean the substrate W adjacent the center of rotation of the substrate W. Then, the cleaning brush 20, the ultrasonic cleaning nozzle 30, and the high-pressure cleaning nozzle 130 pivot from the positions O1, O2, O3 toward the positions A1, A2, A3, respectively. After completion of a sequence of driving processes in accordance with the processing pattern of FIG. 12, the three cleaning means repeatedly reciprocate between the positions A1 and B1, between the positions A2 and B2, and between the positions A3 and B3, respectively, in accordance with the pattern reverse to the above described processing pattern.

The above described processing allows the cleaning brush 20, the ultrasonic cleaning nozzle 30, and the high-pressure cleaning nozzle 130 to operate simultaneously to perform the cleaning process without interference therebetween, reducing the cleaning time and enhancing the cleaning efficiency. The cleaning brush 20, the ultrasonic cleaning nozzle 30, and the high-pressure cleaning nozzle 130 are used simultaneously to clean the substrate W. This provides the synergistic effect of cleaning, enhancing the cleaning effects throughout the substrate W while ensuring the cleaning adjacent the center of rotation of the substrate W. In particular, kinetic energy by rotation is difficult to act upon the portion adjacent the center of rotation of the substrate W, and it is accordingly difficult to remove contamination from that portion. However, the synergistic effect of cleaning using simultaneously the cleaning brush 20, the ultrasonic cleaning nozzle 30, and the high-pressure cleaning nozzle 130 enhances the cleaning effects adjacent the center of rotation of the substrate W. If three or more cleaning elements are provided, any processing pattern may be produced on the condition that the cleaning elements do not interfere with each other.

The above discussed rotary substrate cleaning apparatus is adapted such that the plurality of cleaning elements do not interfere with each other adjacent the center of rotation of the substrate W. However, if the interference occurs, the processing pattern may be produced so that the plurality of cleaning elements are not located adjacent the center of rotation of the substrate W at the same time to achieve the cleaning process.

Figure 13:
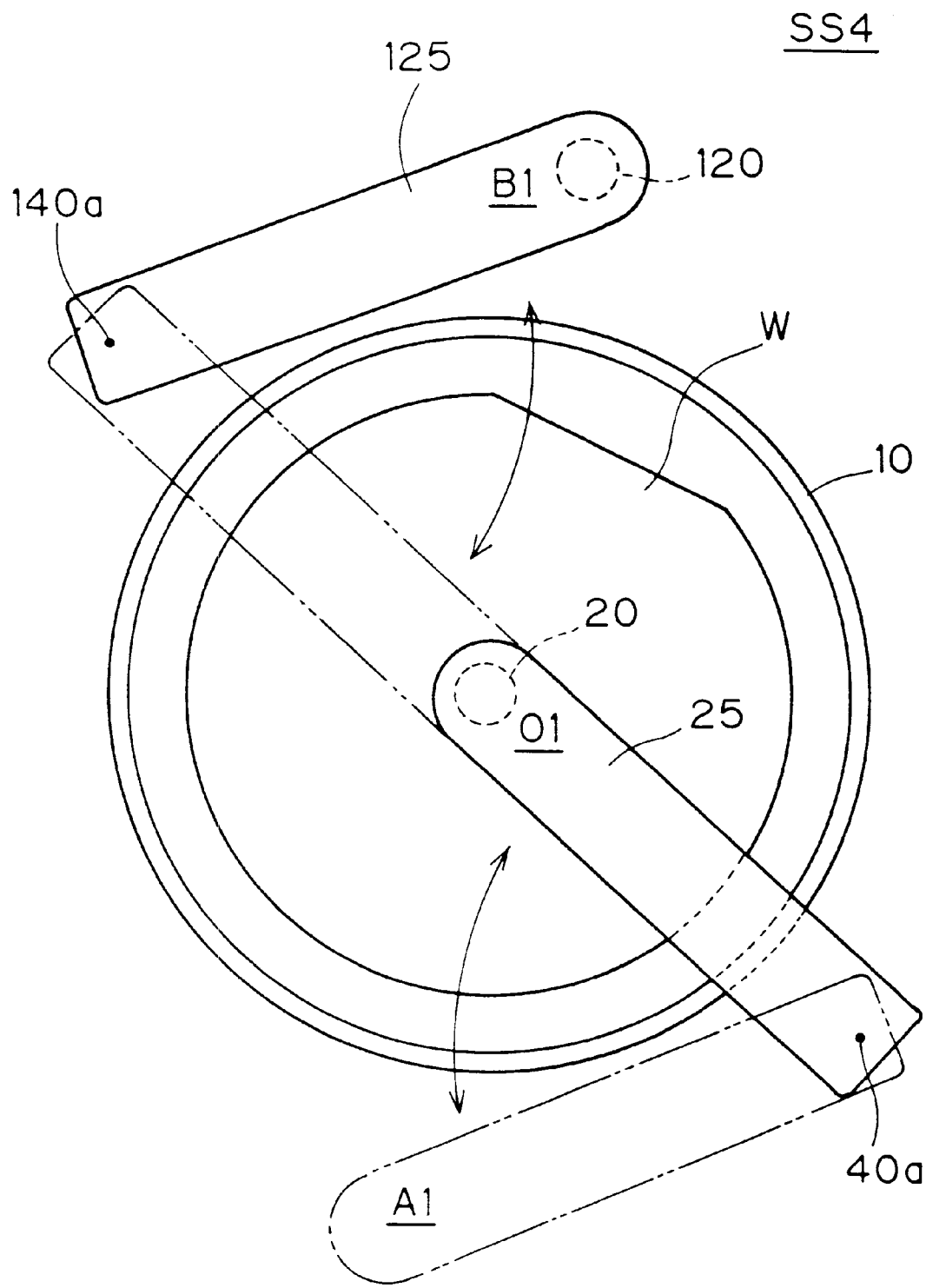
FIG. 13 is a plan view of a rotary substrate cleaning apparatus having two cleaning brushes.

FIG. 13 is a plan view of a rotary substrate cleaning apparatus SS4 having two cleaning brushes. The rotary substrate cleaning apparatus SS4 comprises the cleaning brush 20 serving as a contact-type or closely-spaced-type cleaning elements, and a cleaning brush 120 of the same type as the cleaning brush 20. The cleaning brush 120 is similar in construction and function to the cleaning brush 20. More specifically, the cleaning brush 120 is mounted on a brush arm 125 which in turn is permitted to pivot about a pivot axis 140a and vertically move by a pulse motor not shown.

The cleaning brush 120 of the rotary substrate cleaning apparatus SS4 reciprocates between the positions O1 and B1 to clean the substrate W. In the repeated reciprocal movement, the cleaning brush 120, similar to the cleaning brush 20, is in contact with or in closely spaced relation to the surface of the substrate W to be cleaned while moving from the position O1 toward the position B1, that is, from adjacent the center of rotation of the substrate W toward the periphery thereof, but is spaced apart from the surface of the substrate W to be cleaned while moving from the position B1 toward the position O1, that is, from the periphery of the substrate W toward adjacent the center of rotation thereof.

As illustrated in FIG. 13, the cleaning brushes 20 and 120 are the contact-type or closely-spaced-type cleaning elements which may clean the substrate W adjacent the center of rotation thereof in contact with or in closely spaced relation to the substrate W, and thus interfere with each other adjacent the center of rotation thereof.

Figure 14:
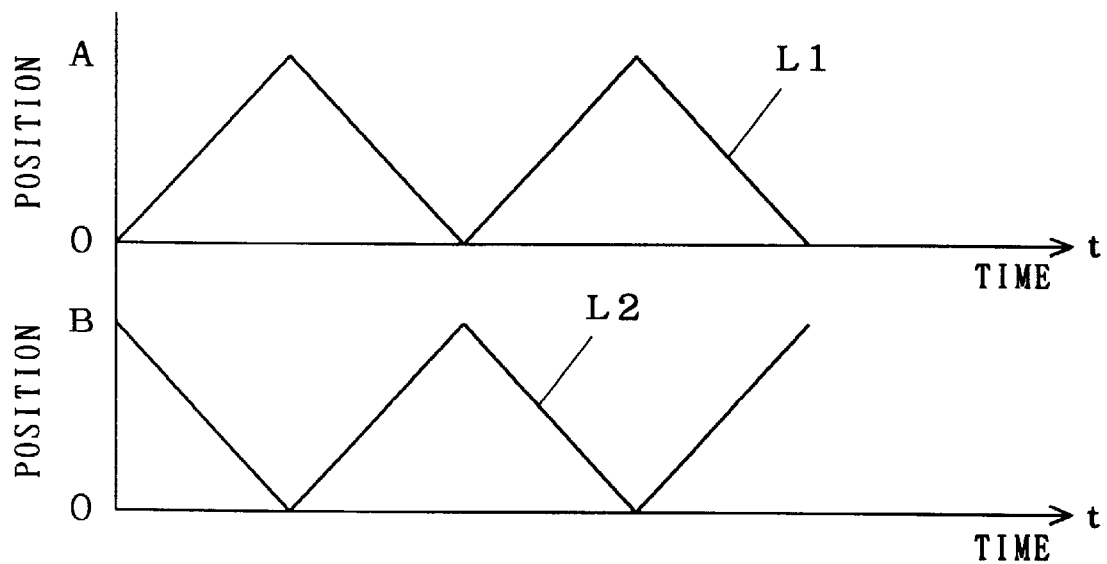
FIG. 14 illustrates a processing p pattern applied to the rotary substrate cleaning apparatus of FIG. 13.

FIG. 14 illustrates a processing pattern applied to the rotary substrate cleaning apparatus SS4. In FIG. 14, the lines L1 and L2 indicate the operation patterns of the cleaning brushes 20 and 120, respectively. The position A1 of the cleaning brush 20 and the position B1 of the cleaning brush 120 shown in FIG. 13 correspond respectively to the positions A and B of FIG. 14. Likewise, the position O1 of the cleaning brushes 20 and 120 corresponds to the position O of FIG. 14.

In the rotary substrate cleaning apparatus SS4, the CPU 81 judges whether or not the two cleaning brushes interfere with each other when the cleaning process is performed in accordance with the processing pattern produced by the operator as above described. The two cleaning brushes of the rotary substrate cleaning apparatus SS4 interfere with each other in the case where the cleaning brushes 20 and 120 are located adjacent the position O1, that is, the center of rotation of the substrate W at the same time. In such a case, the CPU 81 requests the reproduction of the processing pattern.

Since the processing pattern shown in FIG. 14 creates no possibility that the two cleaning brushes interfere with each other, the cleaning process is performed in accordance with the processing pattern of FIG. 14. In accordance with the processing pattern of FIG. 14, the cleaning brushes 20 and 120 repeat the reciprocal movement in the same cycle to perform the cleaning process, but there is a ½ phase shift therebetween. More specifically, the cleaning brush 120 is located at the position B1 when the cleaning brush 20 is located at the position O1. As the cleaning brush 20 pivots toward the position A1, the cleaning brush 120 pivots toward the position O1. The cleaning brush 120 reaches the position O1 when the cleaning brush 20 reaches the position A1. The cleaning brush 20 then starts pivoting toward the position O1, and the cleaning brush 120 starts pivoting toward the position B1. Such a series of operations are subsequently repeated, whereby the two cleaning brushes cooperate to clean the substrate W.

Figure 15:
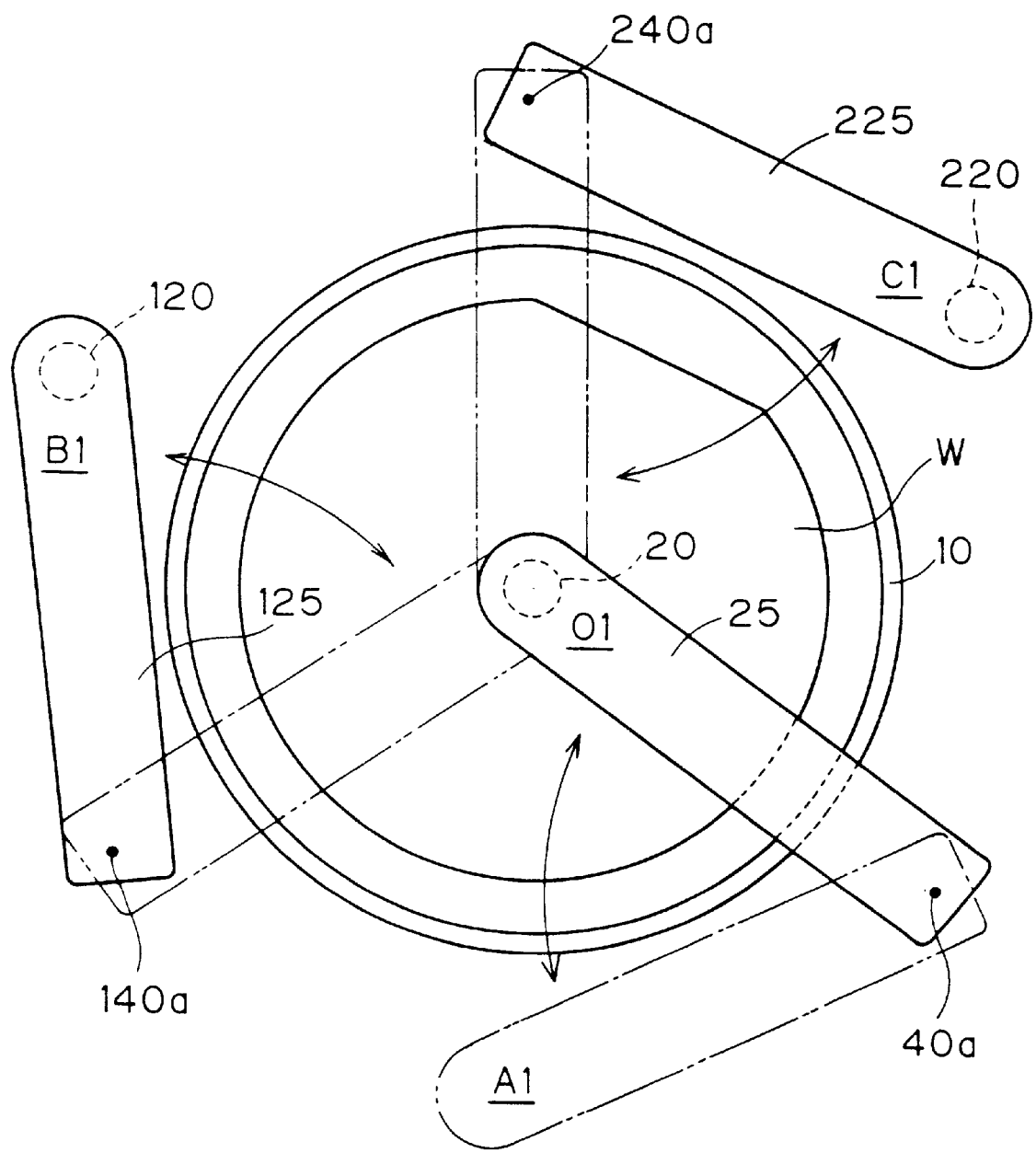
FIG. 15 is a plan view of a rotary substrate cleaning apparatus having three cleaning brushes.

FIG. 15 is a plan view of a rotary substrate cleaning apparatus SS5 having three cleaning brushes. The rotary substrate cleaning apparatus SS5 comprises the cleaning brush 20 serving as the contact-type or closely-spaced-type cleaning elements, and cleaning brushes 120 and 220 of the same type as the cleaning brush 20. The cleaning brush 220 is similar in construction and function to the cleaning brushes 20 and 120. The cleaning brush 220 is mounted on a brush arm 225 which in turn is permitted to pivot about a pivot axis 240a and vertically move by a pulse motor not shown.

The cleaning brush 220 of the rotary substrate cleaning apparatus SS5 reciprocates between the positions O1 and C1 to clean the substrate W. In the repeated reciprocal movement, the cleaning brush 220, similar to the cleaning brush 20, is in contact with or in closely spaced relation to the surface of the substrate W to be cleaned while moving from the position O1 toward the position C1, that is, from adjacent the center of rotation of the substrate W toward the periphery thereof, but is spaced apart from the surface of the substrate W to be cleaned while moving from the position C1 toward the position O1, that is, from the periphery of the substrate W toward the center of rotation thereof.

The three cleaning brushes 20, 120 and 220 are the contact-type or closely-spaced-type cleaning elements which may clean the substrate W adjacent the center of rotation thereof in contact with or in closely spaced relation to the substrate W, and thus interfere with each other adjacent the center of rotation thereof.

Figure 16:
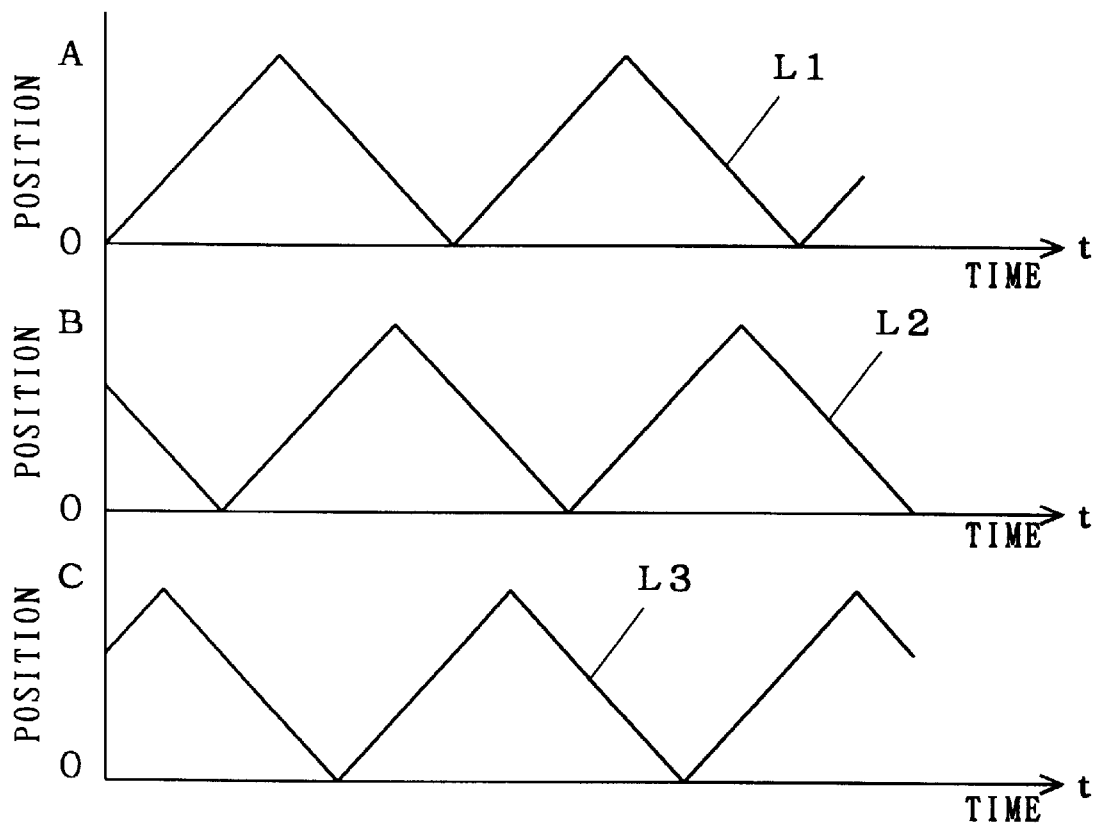
FIG. 16 illustrates a processing pattern applied to the rotary substrate cleaning apparatus of FIG. 15.

FIG. 16 illustrates a processing pattern applied to the rotary substrate cleaning apparatus SS5. In FIG. 16, the lines L1, L2 and L3 indicate the operation patterns of the cleaning brushes 20, 120 and 220, respectively. The position A1 of the cleaning brush 20, the position B1 of the cleaning brush 120, and the position C1 of the cleaning brush 220 shown in FIG. 15 correspond respectively to the positions A, B and C of FIG. 16. Likewise, the position O1 of the cleaning brushes 20, 120 and 220 corresponds to the position O of FIG. 16.

Since the three cleaning brushes are not located adjacent the position O1, that is, the center of rotation of the substrate W, at the same time, the processing pattern shown in FIG. 16 creates no possibility that the three cleaning brushes interfere with each other, and the cleaning process is performed in accordance with the processing pattern of FIG. 16. In accordance with the processing pattern of FIG. 16, the three cleaning brushes repeat the reciprocal movement in the same cycle to perform the cleaning process, but there is a ⅓ phase shift therebetween. The three cleaning brushes cooperate to clean the substrate W.

The above described processing permits the plurality of contact-type or closely-spaced-type cleaning elements of the same type to cooperate to clean the substrate W, reducing the cleaning time. Thus, when the substrate to be cleaned has a large diameter on the order of 300 mm, the rotary substrate cleaning apparatus of the present invention may reduce the cleaning time for this substrate to achieve cleaning efficiency obtained by a substrate having a diameter of 200 mm.

Although one preferred embodiment of the present invention has been described hereinabove, the present invention is not limited to the preferred embodiment. For instance, the ultrasonic cleaning nozzle 30 of the rotary substrate cleaning apparatus SS may be replaced with the high-pressure cleaning nozzle 130 or cleaning chemical dispensing nozzle (not shown) which dispense cleaning chemical contained hydrogen peroxide, hydrofluoric acid or ammonia etc.

The plurality of cleaning elements of this preferred embodiment may include any combination of the cleaning brush 20, the ultrasonic cleaning nozzle 30, the high-pressure cleaning nozzle 130, and cleaning chemical dispensing nozzle (not shown). For example, only the plurality of ultrasonic cleaning nozzle 30 may be used, or only the plurality of high-pressure cleaning nozzle 130 may be used.

While the invention has been described in detail, the foregoing description is in all aspects illustrative and not restrictive. It is understood that numerous other modifications and variations can be devised without departing from the scope of the invention.

We claim:

1. An apparatus for cleaning a surface of a substrate while rotating said substrate, said apparatus comprising:

a) a plurality of cleaning elements operable to scan said surface for cleaning said surface along respective predetermined paths each including a center of said surface;

b) a plurality of driving elements for driving said plurality of cleaning elements, respectively;

c) a controller for controlling said plurality of driving elements such that a cleaning process of said surface includes a simultaneous cleaning operation of said plurality of said cleaning elements on said surface;

d) an inputting element for inputting at least one driving pattern for said plurality of cleaning elements; and e) a memory for storing said at least one driving pattern;

wherein said controller controls said plurality of driving elements in accordance with said at least one driving pattern.

2. The apparatus of claim 1, wherein said plurality of cleaning elements comprise:

a-1) a brush for scanning said surface along a first path including said center of said surface; and a-2) a nozzle for rinsing said surface along a second path including said center of said surface.

3. The apparatus of claim 2, wherein said nozzle has a nozzle head inclined from a vertical direction of said surface.

4. The apparatus of claim 1, wherein said plurality of cleaning elements comprise:

a-3) a plurality of brushes for scanning said surface along respective predetermined paths including said center of said surface to clean said surface, and said controller controlling said plurality of driving elements without interference between said plurality of brushes.

* * * * *